United States Patent

Tomozane et al.

Patent Number: 5,143,858
Date of Patent: Sep. 1, 1992

[54] METHOD OF FABRICATING BURIED INSULATING LAYERS

[75] Inventors: Mamoru Tomozane; H. Ming Liaw, both of Scottsdale, Ariz.

[73] Assignee: Motorola, Inc., Schaumburg, Ill.

[21] Appl. No.: 502,906

[22] Filed: Apr. 2, 1990

[51] Int. Cl.$^5$ .................... H01L 21/265; H01L 21/76
[52] U.S. Cl. ........................................ 437/24; 437/62; 437/83
[58] Field of Search ............................. 437/24, 62, 83

[56] References Cited

U.S. PATENT DOCUMENTS 4,863,878  9/1989  Hite ..................................... 437/62

FOREIGN PATENT DOCUMENTS

| 0059090 | 5/1979 | Japan | 437/24 |
| 0211749 | 12/1982 | Japan | 437/24 |
| 0060556 | 4/1983 | Japan | 437/24 |
| 0079612 | 4/1987 | Japan | 437/24 |

OTHER PUBLICATIONS

Dale Hill et al., "The Reduction of Dislocations in Oxygen Implanted Silicon-on-Insulator Layers by Sequential Implantation and Anneal", J. Appl. Phys. 63(10), May 15, 1988 pp. 4933-4936.

Primary Examiner—Olik Chaudhuri
Assistant Examiner—Ourmazd Ojan
Attorney, Agent, or Firm—Miriam Jackson

[57] ABSTRACT

A thick buried insulating layer is formed by employing a multiple semiconductor layer growth/implant/anneal cycle. A first buried insulating layer is formed in a semiconductor substrate by implanting a dopant which reacts with the substrate to form an insulating layer and then annealing the substrate. Subsequently, a thin semiconductor layer is grown on the surface of the substrate. This is followed by a second implantation of the dopant which reacts with the substrate to form an insulating layer and an anneal to form a second buried insulating layer. The two buried insulating layers may be continuous to form a single, thick buried insulating layer or may be discontinuous to form two buried insulating layers separated by a semiconductor layer. The cycle may be repeated until a desirable thickness of the buried insulating layer is achieved or until a desirable number of buried insulating layers are formed.

7 Claims, 1 Drawing Sheet

5,143,858

METHOD OF FABRICATING BURIED INSULATING LAYERS

BACKGROUND OF THE INVENTION

This invention relates, in general, to semiconductor processing, and more particularly, to a method of fabricating a buried insulating layer.

Silicon On Insulator (SOI) structures are comprised of a substrate, an insulating layer on the substrate, and a superficial semiconductor layer on the insulating layer. SOI structures are used to electrically isolate an integrated circuit fabricated on a thin silicon layer from the substrate. The buried insulating layer electrically isolates the substrate from the superficial semiconductor layer. SOI structures can be formed by a Separation by IMplantation of OXygen (SIMOX) method. A typical SIMOX method comprises implanting oxygen into a silicon substrate or bulk silicon wafer. The oxygen reacts with the silicon to form a silicon dioxide layer during the implantation of oxygen and during a subsequent thermal anneal. The silicon dioxide layer which is formed in the substrate is called a buried silicon dioxide (oxide) layer. The silicon left at the surface is called a superficial silicon layer.

It is desirable to have a thick buried oxide layer in order to lower the capacitance and increase the breakdown voltage between the superficial silicon layer and the substrate. The capacitance and breakdown voltage of the buried oxide layer are important characteristics to control especially when bipolar or power devices are formed on the SOI structure. A buried oxide layer formed by using the conventional SIMOX method typically is limited to a thickness of approximately 0.3 microns. The capacitance of a buried oxide layer of this thickness may be too high for certain applications, and thus it would be desirable to increase the thickness in order to lower the capacitance. In addition, the breakdown voltage of the buried oxide layer of this thickness is low for high voltage power devices.

A way of increasing the thickness of the buried oxide layer has been achieved by implanting a very high dose of oxygen into the substrate. This method is unacceptable, however, because the resulting dislocation density in the superficial silicon layer is proportional to the implant dose. In addition, the thickness of the superficial silicon layer can not be controlled separately from that of the buried oxide layer. When a high oxygen dose is used, the thickness of the superficial semiconductor layer decreases and the dislocation density increases.

By now it should be appreciated that it would be advantageous to provide an alternative method of forming a thick buried insulating layer in order to improve the breakdown voltage and reduce the capacitance of the buried insulating layer.

Accordingly, it is an object of the present invention to provide an improved method of forming a thick buried insulating layer.

Another object of the present invention is to provide a method of increasing the breakdown voltage of a buried insulating layer.

A further object of the present invention is to provide a method of reducing the capacitance of a buried insulating layer.

Yet another object of the present invention is to provide a method of forming a thick buried insulating layer with a substantially lower density of dislocations induced by the implantation of oxygen.

Yet a further object of the present invention is to provide a method of controlling the thickness of a buried insulating layer separately from that of the superficial silicon layer.

Still another object of the present invention is to provide a method of forming multiple buried insulating layers.

SUMMARY OF THE INVENTION

In accordance with the present invention, the above and other objects and advantages are provided by a multiple epitaxial growth/implant/anneal cycle. A first buried insulating layer is formed in a semiconductor substrate by implanting a dopant which reacts with the substrate to form an insulating layer, and then annealing the substrate to complete the reaction and reduce ion implant damage. Subsequently, a thin semiconductor layer is epitaxially grown on the surface of the substrate. The defect density in the epitaxial layer is lowered because of annihilation of some dislocation pairs during the epitaxial growth. This is followed by another ion implantation of the dopant which reacts with the substrate to form an insulating layer and an anneal to form a second buried layer. The second buried insulating layer can be either continuous or discontinuous with the first buried insulating layer. When they are discontinuous, the sandwiched silicon layer can be used as an electrical shield plate or buried contact plate. The second buried insulating layer can be of a different insulating material than the first buried insulating layer. This epitaxial growth/implant/anneal cycle may be repeated to achieve a continuous buried insulating layer of a desirable thickness or a multiple number of discontinuous buried insulating layers.

DETAILED DESCRIPTION OF THE DRAWINGS

Figure 1:
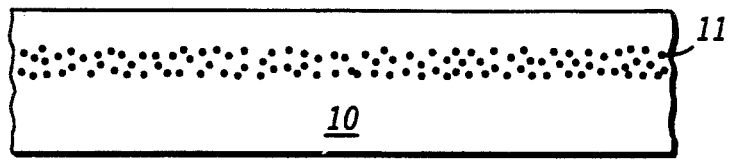
FIGS. 1-5 illustrate enlarged, cross-sectional views of a structure at different stages of fabrication, according to a first embodiment of the present invention.

FIG. 1 illustrates an enlarged, cross-sectional view of an embodiment of the present invention at a beginning stage of fabrication. First, a bulk semiconductor wafer or substrate 10 is provided. Substrate 10 is silicon in this embodiment, however other semiconductor materials may be used. Next, a dopant which will react with substrate 10 to form an insulating layer, such as oxygen, nitrogen, or the like, is ion implanted into substrate 10. In the embodiment described herein, the dopant is comprised of an oxygen 11. The dose and the energy at which oxygen 11 is implanted will determine how far oxygen 11 will be implanted into substrate 10. In one example, an oxygen 11 dose of approximately $1.8 \times 10^{18}$ atoms/cm$^2$ and an energy of approximately 200 keV is used, resulting in the peak concentration of oxygen 11 implanted to a depth of approximately 0.30 micrometers into substrate 10. The ion implantation dose and energy used is typically the same as that used in a conventional SIMOX process.

Figure 2:
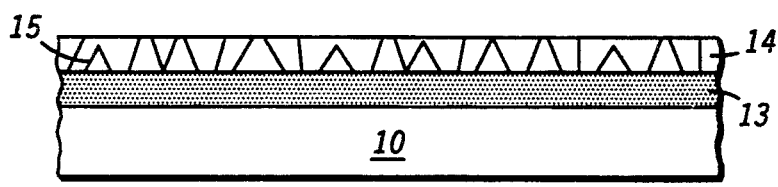

FIG. 2 illustrates the structure of FIG. 1 after an anneal. The anneal is preferably carried out at a temperature of approximately 1250° C. to 1300° C. for two to six hours in an ambient comprising an inert gas, such as argon, and a small amount of oxygen to prevent surface damage. However, a higher or lower temperature may be used, and the presence of oxygen may not be required. After the anneal, a buried insulating layer, a buried oxide layer 13 in this embodiment, is completely formed in substrate 10 where oxygen 11 was implanted. A portion of buried oxide layer 13 is actually formed during ion implantation of oxygen 11, because the implantation is carried out at a temperature of approximately 500° to 600 ° C., but was not illustrated in FIG. 1 for convenience. Thus, the anneal completes the formation of buried oxide layer 13. The portion of substrate 10 above buried oxide layer 13 is now referred to as a superficial semiconductor layer 14. It is inevitable that a high degree of damage to the crystal lattice of semiconductor substrate 10 occurs by the high dose of ion implantation. The crystal lattice damage is transformed into threading dislocations 15 after thermal anneal. Threading dislocations 15 are generated at the interface between superficial silicon layer 14 and buried oxide layer 13, and propagate upward to terminate at the surface of superficial semiconductor layer 14. Some of threading dislocations 15 do not propagate to the surface because some threading dislocations 15 form complete loops. At this stage in the process, buried oxide layer 13 is typically of a thickness of approximately 0.3 micrometers. The structure illustrated in FIG. 2 may be a conventionally formed SIMOX structure.

Figure 3:
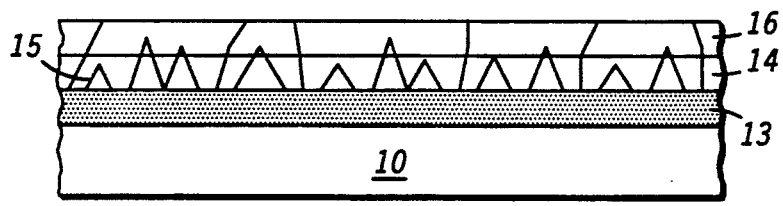

FIG. 3 illustrates the structure of FIG. 2 further along in the process. A semiconductor layer 16 is grown on superficial semiconductor layer 14, preferably by standard epitaxial growth methods known in the art. Semiconductor layer 16 is of the same type as substrate 10, thus silicon in this embodiment. The chosen thickness of semiconductor layer 16 depends on the dose and energy that will be used to implant the oxygen as is described with reference to FIG. 4. During epitaxial growth of the semiconductor layer 16, threading dislocations 15 propagate into it, but some threading dislocations 15 are annihilated by emerging into a complete loop and terminating propagation. Therefore, the dislocation density at the top of the semiconductor layer 16 is considerably lower than that at the surface of original superficial semiconductor layer 14.

Figure 4:
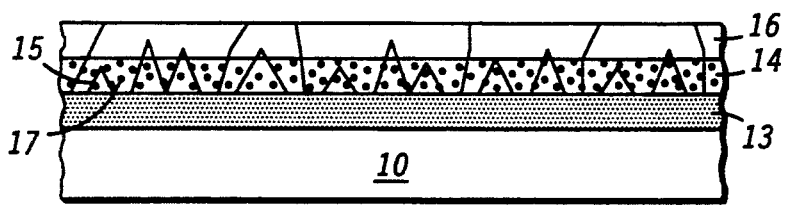

FIG. 4 illustrates the structure of FIG. 3 after another ion implantation of oxygen 17. In this embodiment, the peak concentration of oxygen 17 is positioned in the middle of superficial semiconductor layer 14. The depth at which oxygen 17 is implanted into superficial semiconductor layer 14 is dependent upon the dose and energy used in ion implantation and the thickness of semiconductor layer 16.

Figure 5:
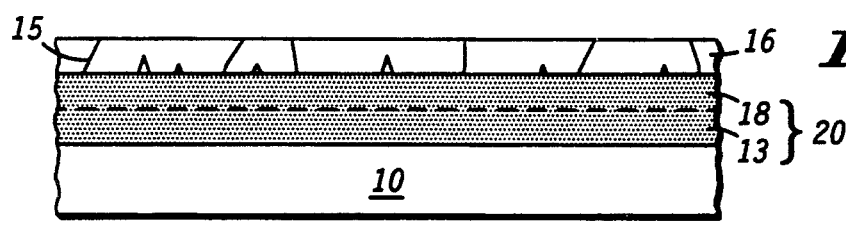

FIG. 5 illustrates the structure of FIG. 4 after an anneal. An anneal as used previously with reference to FIG. 2 may be used. The silicon of superficial semiconductor layer 14 reacts with oxygen 17 to convert superficial semiconductor layer 14 into a buried oxide layer 18. The interface between buried oxide layer 18 and buried oxide layer 13 is delineated by a dotted line because both layers actually form a continuous buried oxide layer 20 of a thickness of approximately 0.5 to 0.6 microns. Because buried oxide layer 18 is formed by ion implanting oxygen through newly grown semiconductor layer 16, which has lower dislocation density than layer 14, the SIMOX quality is improved. In addition, the thickness of semiconductor layer 16, which can now be called a superficial semiconductor layer 16, is independent of the thickness of continuous buried oxide layer 20. The process steps illustrated in FIGS. 3-5, the semiconductor layer growth/implant/anneal cycle, may be repeated until continuous buried oxide layer 20 is of a desirable thickness. Thus, buried oxide layer 20 may be fabricated thick enough to provide a low capacitance and a high breakdown voltage and with a low defect density.

Figure 6:
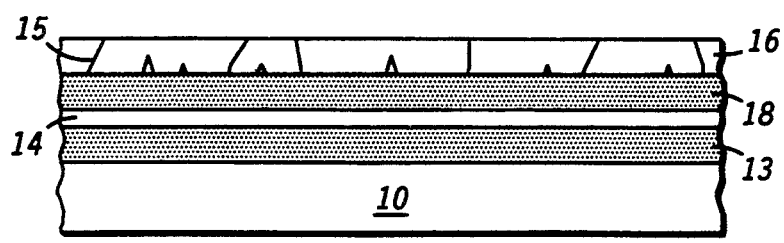
FIG. 6 illustrates an enlarged, cross-sectional view of a structure at a particular stage in fabrication, according to a second embodiment of the present invention.

FIG. 6 illustrates the structure of FIG. 3 further along in the fabrication process, according to a second embodiment of the present invention. The embodiment shown in FIG. 5 can be varied so that buried oxide layer 18 is not continuous with buried oxide layer 13. This may be accomplished by increasing the thickness of semiconductor layer 15 and/or decreasing the ion implant energy and dose of oxygen 17. Semiconductor layer 14 sandwiched between buried oxide layers 18 and 13 can be used as an electrical shield plate or a buried conductive plate. Furthermore, either buried oxide layer 13 or 18 may be a buried nitride layer instead of oxide. Since the dielectric strength of nitride is two times the strength of oxide, this embodiment can withstand a higher breakdown voltage between the top semiconductor layer 16 and substrate 10.

By now it should be appreciated that an improved method of fabricating a thick buried oxide layer or a number of buried oxide layers has been provided. By using the method of the present invention a buried insulating layer having increased breakdown voltage and low capacitance may be fabricated. In addition, the defect density in the epitaxial layer is low. A multiple number of buried insulating layers may also be provided.

We claim:

1. A method of fabricating a buried insulating layer, comprising the steps of:
   providing a semiconductor substrate;
   implanting a first dopant which reacts to form an insulating layer to a predetermined depth in the semiconductor substrate;
   annealing the semiconductor substrate to form a first buried insulating layer in the semiconductor substrate, wherein a portion of the semiconductor substrate above the buried insulating layer is called a superficial semiconductor layer;
   forming a semiconductor layer on the superficial semiconductor layer;
   implanting a second dopant which reacts to form an insulating layer into the superficial semiconductor layer and the semiconductor layer; and
   annealing the semiconductor substrate to form a second buried insulating layer, wherein the first buried insulating layer and the second buried insulating layer are separated by a portion of the superficial semiconductor layer.

2. The method of claim 1 further comprising repeating the steps of forming the semiconductor layer, implanting the second dopant which reacts to form an insulating layer, and annealing the semiconductor substrate until a desirable number of buried insulating layers are formed.

3. The method of claim 1 wherein the first buried insulating layer and the second buried insulating layer are comprised of different insulating materials.

4. The method of claim 1 wherein the first and the second dopants which react to form an insulating layer are comprised of oxygen.

5. The method of claim 4 wherein the oxygen is implanted at a dose approximately equal to $1.8 \times 10^{18}$ atoms/cm$^2$ and at an energy of approximately 200 keV.

6. The method of claim 1 wherein the first and the second dopants which react to form an insulating layer are comprised of nitrogen.

7. A method of fabricating a buried insulating layer, comprising the steps of:

providing a structure which is comprised of a semiconductor substrate, a first buried insulating layer on the semiconductor substrate, and a superficial semiconductor layer on the buried insulating layer;

forming a semiconductor layer on the superficial semiconductor layer;

implanting a dopant which reacts with the superficial semiconductor layer to form an insulating layer, such that the peak concentration of the dopant is positioned in the superficial semiconductor layer; and annealing the structure to form a second buried insulating layer, wherein the first buried insulating layer and the second buried insulating layer are separated by a portion of the superficial semiconductor layer.

* * * * *